United States Patent
Eibl et al.

(10) Patent No.: US 9,761,770 B2
(45) Date of Patent: Sep. 12, 2017

(54) OPTOELECTRONIC SEMICONDUCTOR CHIP ENCAPSULATED WITH AN ALD LAYER AND CORRESPONDING METHOD FOR PRODUCTION

(71) Applicant: OSRAM Opto Semiconductors GmbH, Regensburg (DE)

(72) Inventors: Johann Eibl, Wald (DE); Sebastian Taeger, Bad Abbach (DE); Lutz Höppel, Alteglofsheim (DE); Karl Engl, Pentling (DE); Stefanie Rammelsberger, Zeitlarn (DE); Markus Maute, Alteglofsheim (DE); Michael Huber, Bad Abbach (DE); Rainer Hartmann, Regensburg (DE); Georg Hartung, Nesselwang (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/760,454

(22) PCT Filed: Jan. 14, 2014

(86) PCT No.: PCT/EP2014/050574
§ 371 (c)(1),
(2) Date: Jul. 10, 2015

(87) PCT Pub. No.: WO2014/114524
PCT Pub. Date: Jul. 31, 2014

(65) Prior Publication Data
US 2015/0372203 A1    Dec. 24, 2015

(30) Foreign Application Priority Data

Jan. 28, 2013    (DE) .................. 10 2013 100 818

(51) Int. Cl.
*H01L 33/00* (2010.01)
*H01L 33/54* (2010.01)
(Continued)

(52) U.S. Cl.
CPC .............. *H01L 33/54* (2013.01); *H01L 33/44* (2013.01); *H01L 33/60* (2013.01); *H01L 33/62* (2013.01);
(Continued)

(58) Field of Classification Search
CPC ......... H01L 2924/0002; H01L 2924/00; H01L 2933/005; H01L 33/405; H01L 33/44;
(Continued)

(56) References Cited

U.S. PATENT DOCUMENTS 7,265,392 B2    9/2007    Hahn et al.
8,445,937 B2    5/2013    Carcia et al.
(Continued)

FOREIGN PATENT DOCUMENTS

CN    1292431 A    4/2001
CN    1791989 A    6/2006
(Continued)

*Primary Examiner* — Teresa M Arroyo
(74) *Attorney, Agent, or Firm* — Slater Matsil, LLP

(57) ABSTRACT

An optoelectronic semiconductor chip includes a semiconductor body with an active region provided for generating electromagnetic radiation, a first mirror layer provided for reflecting the electromagnetic radiation, a first encapsulation layer formed with an electrically insulating material, and a carrier provided for mechanically supporting the first encapsulation layer, the first mirror layer and the semiconductor body. The first mirror layer is arranged between the carrier and the semiconductor body. The first encapsulation layer is arranged between the carrier and the first mirror layer. The first encapsulation layer is an ALD layer.

18 Claims, 4 Drawing Sheets

(51) Int. Cl.
  *H01L 33/44* (2010.01)
  *H01L 33/60* (2010.01)
  *H01L 33/62* (2010.01)
  *H01L 21/02* (2006.01)
  *H01L 33/52* (2010.01)
  *H01L 33/40* (2010.01)

(52) U.S. Cl.
  CPC .... *G01B 2210/306* (2013.01); *H01L 21/0228* (2013.01); *H01L 33/405* (2013.01); *H01L 33/52* (2013.01); *H01L 2924/0002* (2013.01); *H01L 2924/181* (2013.01); *H01L 2933/005* (2013.01)

(58) Field of Classification Search
  CPC ......... H01L 33/54; H01L 33/60; H01L 33/62; H01L 2924/181; H01L 33/52; H01L 27/14; H01L 31/00; H01L 31/0203; H01L 31/048; H01L 21/0228; H01L 21/3141; G01B 2210/306; H01S 5/026
  USPC .......................................................... 257/98
  See application file for complete search history.

(56) References Cited

U.S. PATENT DOCUMENTS

| | | | |
|---|---|---|---|
| 8,698,178 B2 | 4/2014 | Höppel et al. | |
| 8,866,175 B2 | 10/2014 | Engl et al. | |
| 8,946,742 B2 | 2/2015 | Yu et al. | |
| 2004/0066819 A1* | 4/2004 | Johnson | H01S 5/18391 372/45.01 |
| 2009/0004386 A1 | 1/2009 | Makela et al. | |
| 2009/0117679 A1* | 5/2009 | Fritzemeier | H01L 31/0304 438/46 |
| 2010/0171135 A1* | 7/2010 | Engl | H01L 33/382 257/98 |
| 2011/0049555 A1* | 3/2011 | Engl | H01L 33/382 257/98 |
| 2011/0279824 A1* | 11/2011 | Blomberg | G02B 26/001 356/519 |
| 2012/0001221 A1 | 1/2012 | Choi | |
| 2012/0018734 A1* | 1/2012 | Chae | H01L 33/382 257/76 |
| 2012/0049225 A1 | 3/2012 | Wakaki | |
| 2012/0086026 A1* | 4/2012 | Engl | H01L 27/156 257/93 |
| 2012/0326159 A1* | 12/2012 | Bergmann | H01L 33/405 257/76 |
| 2012/0326178 A1* | 12/2012 | Fehrer | H01L 24/24 257/88 |
| 2013/0001510 A1* | 1/2013 | Chu | H01L 33/007 257/13 |
| 2013/0126920 A1 | 5/2013 | Sundgren et al. | |
| 2013/0228798 A1 | 9/2013 | Höppel | |
| 2013/0313604 A1 | 11/2013 | Engl et al. | |
| 2014/0021507 A1 | 1/2014 | Engl et al. | |
| 2014/0034992 A1 | 2/2014 | Ichihara et al. | |
| 2014/0061702 A1 | 3/2014 | Yamamoto et al. | |
| 2014/0319547 A1* | 10/2014 | Rode | H01L 33/36 257/79 |
| 2014/0335272 A1 | 11/2014 | Makela et al. | |
| 2014/0338747 A1* | 11/2014 | Choi | H01L 31/022441 136/258 |
| 2014/0346541 A1* | 11/2014 | Hertkorn | H01L 21/0242 257/95 |
| 2015/0280077 A1 | 10/2015 | Wakaki | |
| 2016/0049556 A1* | 2/2016 | Maute | H01L 33/405 257/98 |
| 2016/0087173 A1* | 3/2016 | Mayer | H01L 33/62 257/88 |
| 2016/0181476 A1* | 6/2016 | Chang | H01L 25/0753 257/13 |
| 2016/0225957 A1 | 8/2016 | Höppel et al. | |

FOREIGN PATENT DOCUMENTS

| | | |
|---|---|---|
| DE | 10049257 A1 | 4/2001 |
| DE | 102009033686 A1 | 1/2011 |
| DE | 102010014667 A1 | 10/2011 |
| DE | 102010044986 A1 | 3/2012 |
| DE | 102010045784 A1 | 3/2012 |
| DE | 102011011140 A1 | 8/2012 |
| DE | 102011016302 A1 | 10/2012 |
| DE | 102011016935 A1 | 10/2012 |
| JP | 2009525406 A | 7/2009 |
| JP | 2011222993 A | 11/2011 |
| JP | 2012069539 A | 4/2012 |
| WO | 2006043796 A1 | 4/2006 |
| WO | 2009061704 A2 | 5/2009 |
| WO | 2011157523 A1 | 12/2011 |
| WO | 2012031852 A1 | 3/2012 |
| WO | 2012034828 A1 | 3/2012 |
| WO | 2012136460 A1 | 10/2012 |
| WO | 2012141031 A1 | 10/2012 |

* cited by examiner

OPTOELECTRONIC SEMICONDUCTOR CHIP ENCAPSULATED WITH AN ALD LAYER AND CORRESPONDING METHOD FOR PRODUCTION

This patent application is a national phase filing under section 371 of PCT/EP2014/050574, filed Jan. 14, 2014, which claims the priority of German patent application 10 2013 100 818.6, filed Jan. 28, 2013, each of which is incorporated herein by reference in its entirety.

TECHNICAL FIELD

Embodiments disclose an optoelectronic semiconductor chip encapsulated with an ALD layer and a corresponding method for making such a chip.

BACKGROUND

International Publication WO 2012/031852 A1 describes an optoelectronic semiconductor chip.

SUMMARY

Embodiments of the invention provide an optoelectronic semiconductor chip which has a particularly long life and an increased efficiency.

An optoelectronic semiconductor chip is provided. The optoelectronic semiconductor chip is, for example, a light-emitting diode chip.

According to at least one embodiment, the optoelectronic semiconductor chip comprises a semiconductor body, which comprises an active region intended for generating electromagnetic radiation. The semiconductor body is, for example, an epitaxially grown semiconductor body, which comprises an n-conductive region, a p-conductive region and an active region between the two conductive regions.

For example, electromagnetic radiation in the spectral range between UV radiation and infrared radiation, particularly in the spectral range of visible light, may be generated in the active region. In particular, it is possible for the semiconductor body to be based on a III-V semiconductor material, for example, a nitride compound semiconductor material.

In the active region of the semiconductor body, when the semiconductor body is supplied with electricity, the electromagnetic radiation is generated, which can at least partly leave the semiconductor body through outer surfaces of the semiconductor body.

According to at least one embodiment of the optoelectronic semiconductor chip, the optoelectronic semiconductor chip comprises a first mirror layer, which is intended for reflection of the electromagnetic radiation. The semiconductor body has, for example, two main surfaces, which are connected to one another by at least one side surface. The first mirror layer may be arranged on one of the two main surfaces. Electromagnetic radiation which is generated in the active region of the semiconductor body partially strikes the first mirror layer and can be reflected there from in the direction of the outer surface of the semiconductor body, where it then partially emerges.

The mirror layer may, for example, be configured to be metallic. In particular, metals such as silver and/or aluminum are suitable for forming the first mirror layer. These metals have a good to very good reflectivity for visible light, but they may have the disadvantage that, particularly when there is an electromagnetic field, as during operation of the optoelectronic semiconductor chip, they are susceptible to diffusion or electromigration. Furthermore, these metals may, for example, oxidize in a moist environment, which reduces the reflectivity.

According to at least one embodiment of the optoelectronic semiconductor chip, the optoelectronic semiconductor chip comprises a first encapsulation layer, which is formed by an electrically insulating material. The first encapsulation layer is intended, in particular, to stop diffusion of material from the first mirror layer into other regions of the optoelectronic semiconductor chip and/or to hinder or prevent ingress of atmospheric gases or moisture into the first mirror layer. The first encapsulation layer is formed by an electrically insulating material and may, in particular, be configured to be electrically insulating.

According to at least one embodiment of the optoelectronic semiconductor chip, the optoelectronic semiconductor chip comprises a carrier, which is intended to mechanically support the first encapsulation layer, the first mirror layer and the semiconductor body. That is to say, the carrier may be the mechanically supporting component of the optoelectronic semiconductor chip. The other components of the optoelectronic semiconductor chip, in particular said components: encapsulation layer, mirror layer and semiconductor body, are then arranged on the carrier.

The carrier may be configured to be electrically insulating or electrically conductive. For the case in which the carrier is configured to be electrically conductive at least in regions, it may be used for electrical connection of the optoelectronic semiconductor chip.

The carrier may, for example, be formed from a ceramic material, a plastic material, a glass, a semiconductor material or a metal. For the case in which the carrier is formed by a metal the carrier may be formed at least in regions by a metal deposited electrolytically or electrolessly. In particular, it is possible for the carrier to be formed from materials such as doped or undoped silicon, germanium, copper or sapphire.

The carrier is preferably not a growth substrate of the semiconductor body of the optoelectronic semiconductor chip. The carrier may in particular be arranged on a side of the semiconductor body which lies opposite the original growth substrate of the semiconductor body. The original growth substrate may be at least partially, in particular fully, removed from the semiconductor body. That is to say, the optoelectronic semiconductor chip is then, in particular, free of a growth substrate of the semiconductor body.

According to at least one embodiment of the optoelectronic semiconductor chip, the first mirror layer is arranged between the carrier and the semiconductor body. That is to say, as seen from the carrier, the carrier is first followed by the mirror layer, on which the semiconductor body is arranged on the side, facing away from the carrier, of the mirror layer. The first mirror layer may be in direct contact with the semiconductor body.

According to at least one embodiment of the optoelectronic semiconductor chip, the first encapsulation layer is arranged at least in regions between the carrier and the first mirror layer. That is to say, as seen from the carrier, the first encapsulation layer follows first. The first mirror layer is arranged on the side of the first encapsulation layer facing away from the carrier. The first encapsulation layer may directly adjoin the first mirror layer. It is, however, also possible in particular for there to be further electrically conductive and/or electrically insulating layers between the first encapsulation layer and the carrier.

According to at least one embodiment of the optoelectronic semiconductor chip, the first encapsulation layer is an ALD layer. That is to say, the first encapsulation layer is formed by means of an ALD (Atomic Layer Deposition) method. By means of an ALD method, it is possible to produce very thin layers which have a polycrystalline or amorphous structure. Since a layer produced by means of ALD grows in proportion to the number of reaction cycles with which the layer is produced, exact control of the layer thickness is possible. By means of the ALD method, it is possible to produce particularly uniform layers, that is to say layers with a particularly uniform thickness.

In other words, the first encapsulation layer is deposited with the aid of an ALD process such as flash ALD, photoinduced ALD or another ALD method. It is in this case also possible in particular to use a high-temperature ALD method, in which the first encapsulation layer is deposited at temperatures of 100° C. or more.

A layer produced by means of an ALD method can be distinguished clearly by means of electron-microscopic examinations, and other analysis methods of semiconductor technology, from layers which are produced by means of alternative methods, for example, conventional CVD (Chemical Vapor Deposition). The feature according to which the encapsulation layer is an ALD layer is therefore, in particular, a physical feature which can be detected on the finished optoelectronic semiconductor chip.

According to at least one embodiment of the optoelectronic semiconductor chip, the optoelectronic semiconductor chip comprises a semiconductor body, which comprises an active region intended for generating electromagnetic radiation. The optoelectronic semiconductor chip furthermore comprises a first mirror layer, which is intended for reflection of the electromagnetic radiation. The optoelectronic semiconductor chip furthermore comprises a first encapsulation layer, which is formed by an electrically insulating material. Lastly, the optoelectronic semiconductor chip comprises a carrier, which is intended to mechanically support the first encapsulation layer, the first mirror layer and the semiconductor body. In the case of the optoelectronic semiconductor chip according to this exemplary embodiment, the first mirror layer is arranged between the carrier and the semiconductor body, the first encapsulation layer is arranged between the carrier and the first mirror layer, and the first encapsulation layer is an ALD layer.

The optoelectronic semiconductor chip described here is based inter alia on the following considerations:

In order to have a long lifetime, optoelectronic semiconductor chips, in particular light-emitting diode chips, must be reliably protected against the effect of moisture and atmospheric gases. If a first mirror layer which is formed by a metal that is susceptible to diffusion and/or electromigration, or has a low resistance to moisture, as is the case, for example, with silver, is used in the optoelectronic semiconductor chip, it proves advantageous for the first mirror layer to be protected against moisture and/or atmospheric gases.

For this protection, for example, an encapsulation layer which is formed by a metal could be used. It has, however, been found that such metal layers can absorb the electromagnetic radiation generated in the semiconductor body during operation. It would furthermore be possible to use layers which are produced by means of a conventional CVD method for the encapsulation of the first layer. Particularly in terms of their stability in relation to moisture, however, these layers prove disadvantageous.

In the case of the optoelectronic semiconductor chip described here, an ALD layer which can reliably protect the first mirror layer against moisture, and at the same time has no absorbing properties for the electromagnetic radiation generated in the semiconductor body, is used as the first encapsulation layer.

A method for producing an optoelectronic semiconductor chip as described here is furthermore provided. All the features disclosed for the optoelectronic semiconductor chip are also disclosed for the method, and vice versa. In the method for producing the optoelectronic semiconductor chip, the first encapsulation layer is produced by means of an ALD method.

The following embodiments and exemplary embodiments relate both to the optoelectronic semiconductor chip and to the method for producing the optoelectronic semiconductor chip.

According to at least one embodiment, the optoelectronic semiconductor chip comprises at least one through-contact, the at least one through-contact passing through the first encapsulation layer, the first mirror layer and the active region. In this case, it is possible for the optoelectronic semiconductor chip to comprise a multiplicity of such through-contacts.

The through-contact is connected to an electrically conductive material. The electrically conductive material passes through the first mirror layer while being electrically insulated from the first mirror layer, and through the active region while being electrically insulated from the active region. The through-contact may, for example, comprise a recess in the semiconductor body, which extends through the p-conductive region of the semiconductor body and the active region of the semiconductor body as far as the n-conductive region of the semiconductor body. By means of the through-contact, the active region can then be electrically contacted from one side of the semiconductor body, for example, from the n-conductive region of the semiconductor body.

In the case of an optoelectronic semiconductor chip which has at least one such through-contact, it is possible in particular for the cover surface of the semiconductor body, facing away from the carrier, to be free of electrical connection regions and/or interconnects for the current distribution. This allows an optoelectronic semiconductor chip in which electromagnetic radiation is absorbed as little as possible or not at all by connection regions and/or interconnects for the current distribution.

According to at least one embodiment, the first encapsulation layer fully covers the carrier on its upper side facing toward the semiconductor body except in regions in which the at least one through-contact passes through the first encapsulation layer. That is to say, the first encapsulation layer is formed as a layer between the carrier and the semiconductor body and has interruptions at most where through-contacts which may be present and which extend through the first encapsulation layer are formed. Otherwise, according to this embodiment the first encapsulation layer is formed surface-wide and fully covers the upper side, facing toward the semiconductor body, of the carrier, without it being necessary for the first encapsulation layer to be in direct contact with the carrier.

According to at least one embodiment, the optoelectronic semiconductor chip comprises a second mirror layer, which is arranged on the lower side, facing toward the carrier, of the through-contact, the first encapsulation layer being arranged in regions between the first mirror layer and the second mirror layer.

The second mirror layer may likewise be formed by a metal, such as silver, susceptible to diffusion and/or electromigration. In this case, it is possible in particular for the second mirror layer to be formed by the same material as the first mirror layer. The second mirror layer is, for example, arranged between the carrier and the semiconductor body. The second mirror layer may be formed on the lower side, facing toward the carrier, of the through-contact. The encapsulation layer is arranged in regions between the first mirror layer and the second mirror layer, so that the encapsulation layer can act as an encapsulation layer for both the first and the second mirror layers.

Because of the materials used, such as $Al_2O_3$ or $SiO_2$, the encapsulation layer is particularly highly transmissive for the electromagnetic radiation generated in the semiconductor body. Like the first mirror layer, the second mirror layer is adapted to reflect electromagnetic radiation generated in the semiconductor body. Because of the good transmissivity of the first encapsulation layer, a particularly large proportion of the electromagnetic radiation can strike the second mirror layer.

According to at least one embodiment, the optoelectronic semiconductor chip comprises a third mirror layer, which extends beyond a side surface of the semiconductor body in a lateral direction, the first encapsulation layer extending at least in regions on the side, facing away from the carrier, of the third mirror layer. The third mirror layer is in this case likewise provided for reflection of electromagnetic radiation generated in the semiconductor body during operation. The third mirror layer may be formed by the same materials as the first or the second mirror layer. That is to say, it is possible in particular for the third mirror layer to be formed by a metal, such as silver or aluminum, susceptible to diffusion and/or electromigration or to consist of one of these materials.

The third mirror layer extends beyond the semiconductor body in a lateral direction. A lateral direction is in this case a direction which extends parallel to the main extent plane of the carrier. That is to say, the third mirror layer extends laterally beyond the semiconductor body. In this way, the third mirror layer can also reflect electromagnetic radiation which emerges from the side surfaces of the semiconductor body and subsequently strikes the carrier. The first encapsulation layer is arranged on the side of the third mirror layer facing away from the carrier, and therefore at least indirectly between the third mirror layer and the semiconductor body. Because of the good transmissivity of the first encapsulation layer for electromagnetic radiation which is generated during operation in the semiconductor body, a particularly large proportion of the electromagnetic radiation passing through the first encapsulation layer strikes the third mirror layer and can thereby be reflected out of the optoelectronic semiconductor chip.

In this case, it is also possible for the second mirror layer and the third mirror layer to be joined together and thereby form a common further mirror layer. This further mirror layer is then not joined to the first mirror layer and is in particular formed in a different plane of the optoelectronic semiconductor chip to the first mirror layer. That is to say, the first mirror layer and the further mirror layer(s) are separated from one another in a vertical direction at least in regions. The vertical direction in this case extends parallel to a growth direction of the semiconductor body and/or perpendicularly to the lateral direction.

According to at least one embodiment, a side surface of the first mirror layer is free of the first encapsulation layer. In particular, it is possible for all the side surfaces of the first mirror layer to be free of the first encapsulation layer. That is to say, the first encapsulation layer is in this case not in direct contact with a side surface of the first mirror layer. In this case, it is possible in particular for the first encapsulation layer not to be in direct contact with the first mirror layer at any position. Furthermore, it is possible for the first encapsulation layer not to be in direct contact with any of the mirror layers of the optoelectronic semiconductor chip.

Furthermore, it is possible for at least one further encapsulation layer, which likewise constitutes a barrier against moisture and/or atmospheric gases, to be arranged between the mirror layers and the first encapsulation layer. Together with the first encapsulation layer, particularly leaktight encapsulation of the mirror layers can be achieved in this way.

According to at least one embodiment of the optoelectronic semiconductor chip, the first encapsulation layer is formed by an electrically insulating material and has a thickness of between at least 0.05 nm and at most 500 nm, in particular at least 30 nm and at most 50 nm, for example, 40 nm. The first encapsulation layer may in this case comprise a multiplicity of sublayers, which are arranged on one another. The first encapsulation layer contains or consists, for example, of one of the following materials: $Al_2O_3$, $SiO_2$, SiN. In this case, it is also possible in particular for the first encapsulation layer to contain a combination of these materials. For example, the first encapsulation layer may be formed as a sequence of sublayers which consist alternately of the materials $Al_2O_3$ and $SiO_2$.

According to at least one embodiment, the optoelectronic semiconductor chip comprises a second encapsulation layer, which is arranged between the carrier and the first encapsulation layer, wherein the second encapsulation layer being electrically insulating, the second encapsulation layer being in direct contact with the first encapsulation layer, and the second encapsulation layer covering at least 90% of the outer surface, facing toward it, of the first encapsulation layer.

The second encapsulation layer may, for example, be a layer which is produced by a CVD method or by a spin-coating method. The second encapsulation layer may at least in regions be arranged between the first encapsulation layer and the second mirror layer and/or the third mirror layer. In this case, it is possible for the second encapsulation layer to directly adjoin the second mirror layer and/or the third mirror layer. The second encapsulation layer is in this case arranged on the upper side, facing away from the carrier, of the second mirror layer and/or of the third mirror layer.

The second encapsulation layer has the advantage that it forms protection for the second mirror layer and/or the third mirror layer during the deposition of the first encapsulation layer. During the deposition of the first encapsulation layer, it is then possible to use materials, for example, precursor materials, which would otherwise damage the material of the mirror layers. If the second mirror layer and the third mirror layer are formed by silver, for example, ozone may thus be used as a precursor material during the production of the first encapsulation layer without damage to the silver mirror or the silver mirrors occurring, since the second encapsulation layer forms protection for the mirror layers.

According to at least one embodiment, the optoelectronic semiconductor chip comprises a third encapsulation layer, which is arranged between the first encapsulation layer and the semiconductor body, wherein the third encapsulation layer being electrically insulating, the third encapsulation layer being in direct contact with the first encapsulation layer, and the third encapsulation layer covering at least 90% of the outer surface, facing toward it, of the first encapsulation layer.

The third encapsulation layer may in this case be formed identically to the second encapsulation layer. Furthermore, it is possible for the third encapsulation layer to directly adjoin the first mirror layer. It is furthermore possible for a further layer, for example, a connection layer consisting of a metal, to be arranged between the third encapsulation layer and the first encapsulation layer. Like the second encapsulation layer, the third encapsulation layer may protect adjacent layers, in particular metal layers, during the production of the first encapsulation layer by means of an ALD method against materials used in the method.

Both the second encapsulation layer and the third encapsulation layer may cover the outer surfaces, facing toward them in each case, of the first encapsulation layer to at least 90%, in particular fully. That is to say, the first encapsulation layer may be fully covered on its main surfaces by the second and third encapsulation layers. The first encapsulation layer is in this way enclosed by the two further encapsulation layers.

According to at least one embodiment, the thickness of the second encapsulation layer and/or the thickness of the third encapsulation layer is at least six times the thickness of the first encapsulation layer. That is to say, the second and third encapsulation layers respectively have a substantially greater thickness than the first encapsulation layer. The second and third encapsulation layers may in this case have layer thicknesses of 300 nm or more.

According to at least one embodiment, the optoelectronic semiconductor chip comprises a fourth encapsulation layer, which fully covers those regions of an outer surface of the semiconductor body which are not covered by the carrier, wherein the fourth encapsulation layer being at least in regions in direct contact with the first encapsulation layer, and the fourth encapsulation layer being an ALD layer. In other words, on its uncovered regions, for example, on its main surface facing away from the carrier and on its side surfaces, the semiconductor body may be coated with a fourth encapsulation layer which is likewise an ALD layer. The fourth encapsulation layer may in this case, for example, be formed identically to the first encapsulation layer. At positions where the first encapsulation layer is exposed, i.e., is not covered by further layers, the first encapsulation layer is in direct contact with the fourth encapsulation layer. In this way, positions at which ALD layers adjoin one another directly (in what follows, also referred to as triple points) are formed. With such a fourth encapsulation layer, it is possible in particular for the semiconductor body to be fully enclosed by encapsulation layers which are produced by an ALD method.

According to at least one embodiment, the optoelectronic semiconductor chip comprises a fifth encapsulation layer, which is electrically insulating and is in direct contact with the fourth encapsulation layer. The fifth encapsulation layer may, for example, be formed identically to the second and/or third encapsulation layer. The fifth encapsulation layer constitutes protection of the fourth encapsulation layer and of the first encapsulation layer. In this case, it is possible for the fifth encapsulation layer also to be in direct contact with the first encapsulation layer in regions. The fifth encapsulation layer is in this case in turn configured to be substantially thicker than the first encapsulation layer and the fourth encapsulation layer. In particular, it is possible for the layer thickness of the fifth encapsulation layer to correspond to at least six times the layer thickness of the first encapsulation layer and/or of the fourth encapsulation layer.

According to at least one embodiment, at least one of the following encapsulation layers comprises at least two partial layers, which are formed by a different material to one another: the second encapsulation layer, the third encapsulation layer, the fifth encapsulation layer. For example, at least one of these layers, in particular all these layers, are layers which are produced by means of a CVD method. The layers may, for example, comprise sublayers. For example, the layers may respectively comprise a first sublayer which is formed by $SiO_2$, a second sublayer which is formed by SiN, a third sublayer which is formed by $SiO_2$, and a fourth sublayer which is formed by SiN. The sublayers are in this case arranged above one another in a vertical direction, perpendicularly to the lateral direction.

For example, the sublayers formed by $SiO_2$ have a thickness of between 130 nm and 170 nm, in particular 150 nm. The sublayers formed by SiN may have a thickness of between 10 nm and 14 nm, in particular 12 nm. In this way, in particular, encapsulation layers are formed which are configured to be particularly impermeable even to materials which are used during the production of the ALD layers, that is to say the first encapsulation layer and the fourth encapsulation layer.

According to at least one embodiment of the optoelectronic semiconductor chip, the optoelectronic semiconductor chip comprises a connection region, which is arranged laterally separated from the semiconductor body, the electrical connection region being laterally enclosed fully by the first encapsulation layer and/or the fourth encapsulation layer. The first connection region is, for example, a connection region which is intended for wire contacting. That is to say, by means of so-called "wire bonding", the electrical connection region can be electrically contacted by means of wire contacting. The first connection region is, for example, connected electrically conductively by means of the first mirror layer to the semiconductor body. The first connection region may then, for example, be used for p-side contacting of the semiconductor body.

According to at least one embodiment of the semiconductor chip, the carrier is configured to be electrically conductive, the carrier being electrically conductively connected to the at least one through-contact. In this case, electrical contacting, for example, from the n-conductive side, of the semiconductor body can take place across the carrier through the through-contact.

According to at least one embodiment, the first encapsulation layer, which is an ALD layer, is produced by means of an ALD method, the first encapsulation layer being deposited at least in regions by using ozone as a precursor. In this case, it is possible for the entire encapsulation layer to be deposited by using ozone as a precursor. Furthermore, it is possible for the encapsulation layer to comprise at least two sublayers, which are, for example, stacked on one another, at least one of the sublayers being produced by means of an ALD method in which ozone is used as a precursor.

It has in this case been found that an ALD layer for which ozone is used as a precursor has a particularly high leak-tightness in relation to moisture. The layer or sublayer which is deposited with ozone as a precursor is, for example, an $Al_2O_3$ layer or an $SiO_2$ layer.

According to at least one embodiment, the first encapsulation layer comprises a first sublayer, which is deposited by using a precursor that is free of ozone, the first sublayer being deposited directly onto one of the mirror layers. That is to say, the first encapsulation layer comprises a sublayer which directly adjoins one of the mirror layers, for example, the first mirror layer. The mirror layer is, for example, formed by silver in this case. Since a layer containing silver may be damaged by the use of ozone as a precursor material, it proves particularly advantageous for the first encapsulation layer in this case to comprise a first sublayer which is deposited without ozone as a precursor. For example, water or oxygen may be used as a precursor material in this case.

The first encapsulation layer furthermore comprises a second sublayer, which is deposited by using a precursor that comprises ozone, the second sublayer being deposited directly onto the first sublayer. That is to say, the second sublayer directly adjoins the first sublayer on the side facing away from the mirror layer. The second sublayer is deposited by using ozone as a precursor material, and therefore has a particularly high leaktightness in relation to moisture. The first sublayer protects the mirror layer on which it is formed against the ozone which is used during the deposition of the second sublayer.

The first sublayer may, for example, have a thickness of between 5 and 10 nm in this case. The second sublayer may then, for example, have a thickness of between 25 and 45 nm.

BRIEF DESCRIPTION OF THE DRAWINGS

The optoelectronic semiconductor chip described here will be explained in more detail below with the aid of exemplary embodiments and the associated figures.

Further exemplary embodiments of a semiconductor chip as described here, as well as of a method as described here, are explained in more detail in connection with FIGS. 2, 3, 4, 5, 6, 7.

Elements which are the same or of the same type, or which have the same effect, are provided with the same references in the figures. The figures and the size proportions of the elements represented in the figures with respect to one another are not to be regarded as true to scale. Rather, individual elements may be represented exaggeratedly large for better representability and/or for better understanding.

DETAILED DESCRIPTION OF ILLUSTRATIVE EMBODIMENTS

Figure 1A:
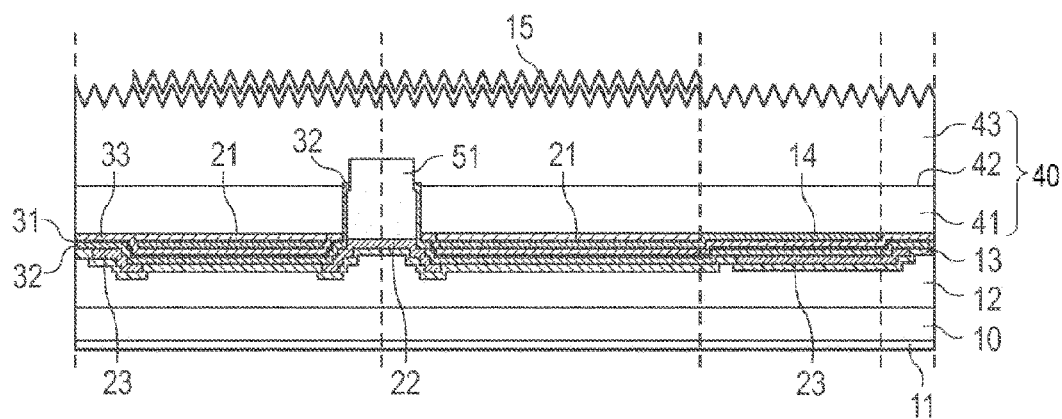
FIGS. 1A, 1B, 1C, 1D show schematic sectional representations of the method steps for the production of an optoelectronic semiconductor chip as described here.
Figure 1B:
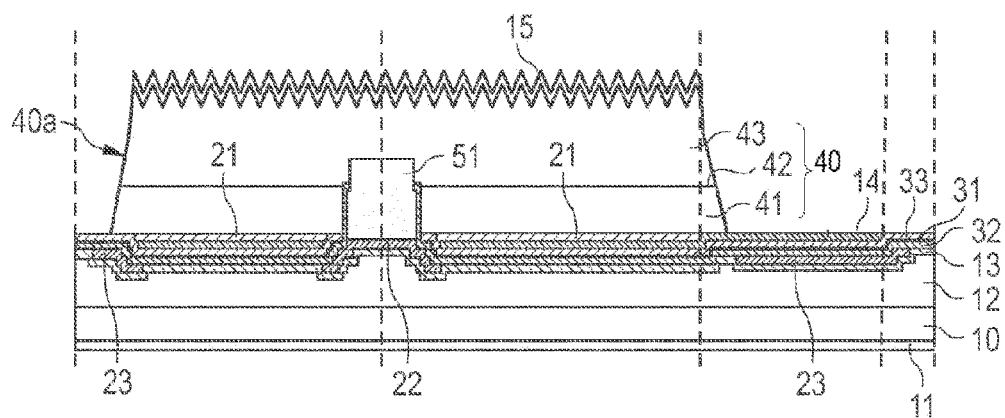
Figure 1C:
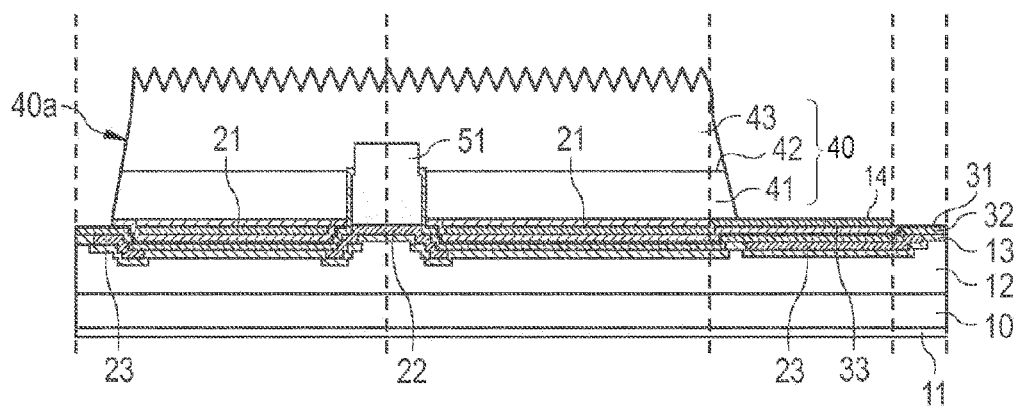
Figure 1D:
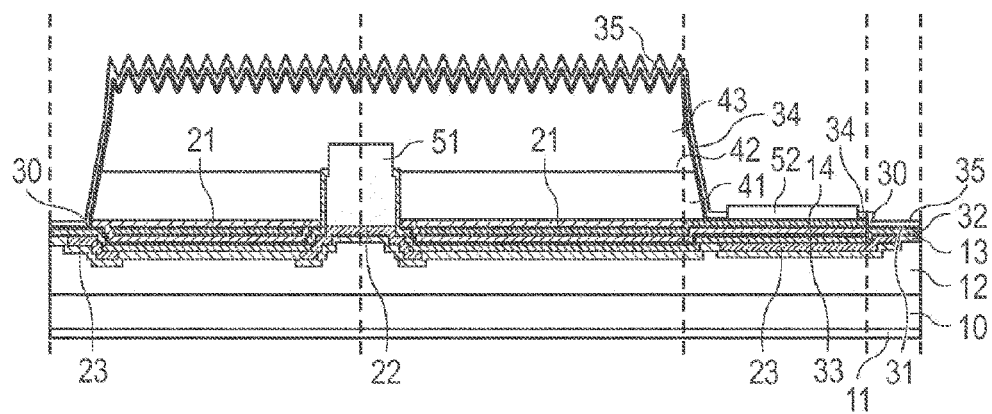

FIG. 1D shows an exemplary embodiment of an optoelectronic semiconductor chip as described here in a schematic sectional representation.

The optoelectronic semiconductor chip comprises a carrier 10. The carrier 10 may, for example, be formed by a metal such as copper or a semiconductor material such as germanium or silicon. In the exemplary embodiment of FIG. 1D, the carrier 10 is configured to be electrically conductive.

The optoelectronic semiconductor chip furthermore comprises a semiconductor body 40. The semiconductor body 40 comprises a p-conductive region 41 which faces toward the carrier 10, an n-conductive region 43 which faces away from the carrier 10, and an active region 42 between the p-conductive region 41 and the n-conductive region 43. On its upper side facing away from the carrier 10, that is to say in the n-conductive region 43, the semiconductor body 40 has roughenings which make emergence of light from the roughened surface more likely.

On its lower side, the carrier 10 comprises a metal layer 11, which, for example, may be a solder metallization. With the metal layer 11, the optoelectronic semiconductor chip may be fastened at the intended position, for example by means of soldering or an electrically conductive adhesive.

In the exemplary embodiment of FIG. 1D, the carrier 10 is configured to be electrically conductive. An electrical connection takes place from the n-conductive side for the optoelectronic semiconductor chip of the exemplary embodiment of FIG. 1D across the carrier 10.

Arranged on the upper side, facing away from the metal layer 11, of the carrier 10, there is a connecting layer 12 which may for example contain gold or consist of gold. The connecting layer 12 may, in particular, be a solder layer.

The connecting layer 12 is followed by the barrier layer 13. For example, the barrier layer 13 prevents diffusion processes between the connecting layer 12 and the subsequent components of the optoelectronic semiconductor chip. The barrier layer 13 may, for example, contain titanium or consist of titanium.

In regions on the side of the barrier layer 13 facing away from the carrier 10, the optoelectronic semiconductor chip comprises the second mirror layer 22 and the third mirror layer 23. The second mirror layer 22 is in this case formed on the lower side of a through-contact 51. At least in regions, the third mirror layer 23 extends beyond the semiconductor body 40 in lateral directions.

The semiconductor body 40 is connected to the carrier 10 on the upper side, facing away from the metal layer 11, of the carrier.

The second and third mirror layers may be joined together and therefore together form a further mirror layer. In this case, it is also possible in particular for the second and third mirror layers to extend without interruptions over the entire cross-sectional area of the optoelectronic semiconductor chip.

The second and third mirror layers are formed by silver in the exemplary embodiment of FIG. 1D.

The second and third mirror layers 22, 23 are followed on their side facing away from the carrier 10 by the second encapsulation layer 32. The second encapsulation layer 32 is configured to be electrically insulating and, for example, is produced by means of a CVD method. For example, the second encapsulation layer 32 comprises a first sublayer, facing toward the second mirror layer 22 and the third mirror layer 23, which sublayer is formed by silicon dioxide and has a thickness of approximately 150 nm. On the side facing away from the carrier 10, this sublayer is followed by a sublayer formed by silicon nitride, which has a thickness of approximately 12 nm. This is in turn followed by an approximately 150 nm thick silicon dioxide layer, which is in turn followed by a 12 nm thick silicon nitride layer.

In particular, the second encapsulation layer 32 in this case protects the second mirror layer 22 and the third mirror layer 23 against moisture, atmospheric gases and materials which are used during the production of the subsequent first encapsulation layer. Thus, for example, the first encapsulation layer may be produced by using ozone without the silver-containing second mirror layer or the silver-containing third mirror layer thereby being damaged.

The first encapsulation layer is an ALD layer, which is produced by means of an ALD method. The first encapsulation layer consists, for example, of aluminum oxide or of silicon dioxide and has a thickness of approximately 40 nm. The first encapsulation layer 31 is distinguished by its particularly good leaktightness in relation to moisture and atmospheric gases. Furthermore, the first encapsulation layer 31 is particularly highly transmissive for the electromagnetic radiation which is generated during operation in the active region 42 of the semiconductor body 40. The optoelectronic semiconductor chip is therefore particularly efficient and has a particularly long lifetime.

In the exemplary embodiment of FIG. 1D, the third encapsulation layer 33 is arranged at least in regions on the upper side, facing away from the second encapsulation layer 32, of the first encapsulation layer 31. The third encapsulation layer 33 may in this case be formed identically to the second encapsulation layer 32.

The connection layer 14, which is formed by an electrically conductive material, is arranged at least in regions on the upper side, facing away from the first encapsulation layer 31, of the second encapsulation layer 32.

The connection layer 14 is in this case electrically separated from the second mirror layer 22 and at least in regions from the through-contact 51 by means of the first encapsulation layer 31, the second encapsulation layer 32 and the third encapsulation layer 33.

The optoelectronic semiconductor chip furthermore comprises a first mirror layer 21, which is electrically conductively connected to the connection layer 14. In the exemplary embodiment of FIG. 1D, the first mirror layer 21 is likewise formed by silver and lies on the lower side of the semiconductor body 40 at the p-conductive region 41.

The through-contact 51 passes through the first encapsulation layer 31, the second encapsulation layer 32, the third encapsulation layer 33, the connection layer 14 and the first mirror layer 21, and it also extends through the p-conductive region 41 and the active region 42 of the semiconductor body 40 into the n-conductive region 43.

In this case, it is possible for the second encapsulation layer 32 likewise to extend into the semiconductor body 40 as far as the n-conductive region 43, and in this way protects for insulation of the through-contact 51 from the p-conductive regions of the optoelectronic semiconductor chip.

The optoelectronic semiconductor chip furthermore comprises an electrical connection region 52, which in the present case is suitable for wire contacting. The connection region 52 is in this case electrically conductively connected by means of the connection layer 14 and the first mirror layer 21 to the p-conductive region of the semiconductor body 40. That is to say, the optoelectronic semiconductor chip can be connected on the p-side by means of the connection region 52.

On the n-side, the optoelectronic semiconductor chip according to the exemplary embodiment of FIG. 1D may be connected by means of the carrier 10 and the through-contact 51, which extends into the n-conductive region 43.

The optoelectronic semiconductor chip furthermore comprises a fourth encapsulation layer 34, which covers the outer surface, facing away from the carrier 10, of the semiconductor body 40. Like the first encapsulation layer 31, the fourth encapsulation layer 34 is an ALD layer, and it may for example be configured identically to the first encapsulation layer 31. In this case, the fourth encapsulation layer 34 is in regions in direct contact with the first encapsulation layer 31 at the triple points 30. In this way, it is possible for the semiconductor body 40 to be fully encapsulated by means of an ALD layer.

The fourth encapsulation layer 34 laterally encloses the connection region 52 fully.

The fourth encapsulation layer 34 also covers the side surfaces 40a of the semiconductor body 40.

On its side facing away from the semiconductor body 40, the fourth encapsulation layer 34 has a fifth encapsulation layer 35, which is for example formed identically to the second and third encapsulation layers.

Overall, the optoelectronic semiconductor chip according to the exemplary embodiment of FIG. 1D is protected particularly well by means of at least two ALD layers 31, 34 against external influences such as moisture and atmospheric gases.

Method steps for production of the optoelectronic semiconductor chip according to FIG. 1D are explained in more detail in connection with FIGS. 1A to 1D.

In the first method step, FIG. 1A, a mask layer 15 is applied in regions onto the not yet mesa-etched semiconductor body 40. The mask layer 15 is for example a hard mask of silicon dioxide, which may have a thickness of at least 300 nm, for example 324 nm.

In the next method step, mesa etching is carried out along the crystal axes of the semiconductor body 40. The etching stops on the connection layer 14, which, for example, has a layer that consists of platinum on its side facing toward the semiconductor body 40. The mesa etching also stops on the third encapsulation layer 33, which is formed for example by silicon dioxide on its outer surface facing away from the semiconductor body 40.

In the next method step, FIG. 1C, dry chemical etching of the mask layer 15 and of the exposed positions of the third encapsulation layer 33 is carried out. To this end, the mask layer 15 and the third encapsulation layer 33 are for example formed identically or at least have the same thickness. Depending on the original thicknesses of the mask layer 15 and of the third encapsulation layer 33, these are partially or fully removed in the exposed regions. The etching depth may for example be carried out by means of endpoint detection on the first encapsulation layer 31, which is for example formed by aluminum oxide. Subsequently, if necessary, cleaning of the p/n junction on the side surface 40a of the semiconductor body 40 is carried out.

Subsequently, FIG. 1D, the application of the already described fourth encapsulation layer 34 and fifth encapsulation layer 35 is carried out. Overall, by means of the method an optoelectronic semiconductor chip as described here can be produced in a particularly simple and economical way.

Figure 2:
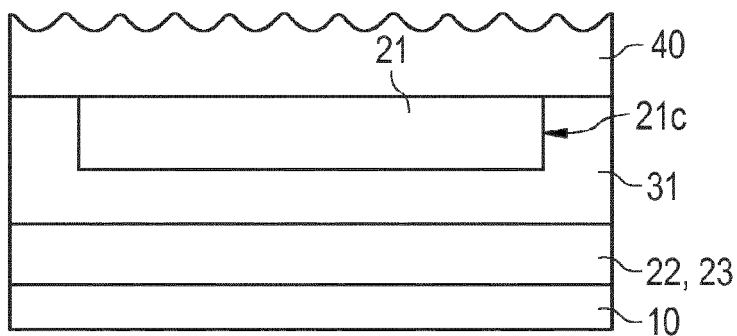

FIG. 2 shows a detail of an optoelectronic semiconductor chip as described here. The semiconductor chip may comprise a semiconductor body as described in connection with FIG. 1D, which comprises a through-contact 51. It is furthermore possible for the semiconductor body 40 not to have a through-contact 51, but for example for n-side contacting of the semiconductor body 40 to be carried out from the upper side, facing away from the first mirror layer 21, of the semiconductor body 40.

According to the exemplary embodiment described in connection with FIG. 2, the first encapsulation layer 31, which is an ALD layer, directly adjoins the first mirror layer 21, which is for example formed by silver. The first encapsulation layer 31 in this case fully covers the lower side, facing away from the semiconductor body 40, of the first mirror layer 21. Furthermore, the first encapsulation layer 31 also fully covers side surfaces 21c of the first mirror layer 21. The first encapsulation layer 31 is in this case formed with a precursor material which is free of ozone. For example, the first encapsulation layer 31 comprises aluminum oxide and/or silicon oxide as a material and has a thickness of 40 nm.

Figure 3:
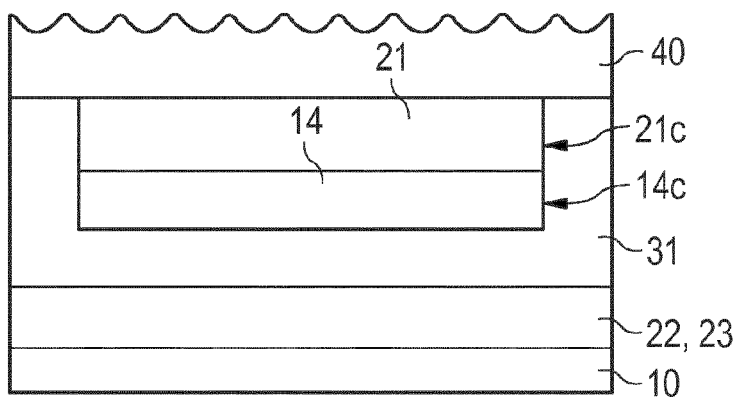

In contrast thereto, FIG. 3 shows an optoelectronic semiconductor chip in which a connection layer 14, which comprises at least one metal layer, is arranged between the first encapsulation layer 31 and the first mirror layer 21. Side surfaces 14c of the connection layer 14 are also fully covered by the first encapsulation layer 31. The second mirror layer 22 and/or the third mirror layer 23 is arranged on the lower side, facing away from the first mirror layer 21, of the first encapsulation layer 31. The further mirror layers 22, 23 extend beyond the connection layer 14 in the lateral direction, so that electromagnetic radiation which does not strike the first mirror layer 21 is reflected by at least one of the further mirror layers.

Figure 4:
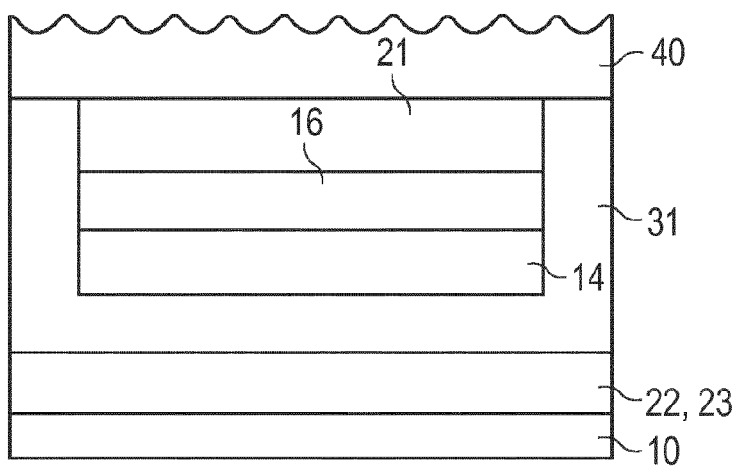

An optoelectronic semiconductor chip in which, in contrast to the exemplary embodiment of FIG. 3, an additional radiation-transmissive connection layer 16 is arranged between the connection layer 14 and the first mirror layer 21, is described in connection with FIG. 4. In this case, it is also possible to omit the metal connection layer 14, so that the first encapsulation layer 31 directly adjoins the radiation-transmissive connection layer 16. The radiation-transmissive connection layer 16 is formed, for example, by a TCO (Transparent Conductive Oxide) material such as ITO or ZnO. The radiation-transmissive connection layer 16 may likewise be suitable for hindering diffusion of material out of the mirror layer 21 into other regions of the optoelectronic semiconductor chip.

Figure 5:
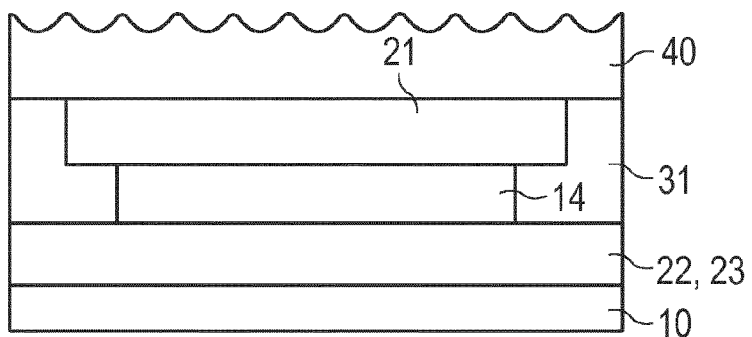

In contrast to the exemplary embodiment of FIG. 3, an exemplary embodiment in which the first encapsulation layer 31 is applied in a structured way and is formed only in the region of the side surfaces 21*c* of the first mirror layer is shown in connection with FIG. 5.

Figure 6:
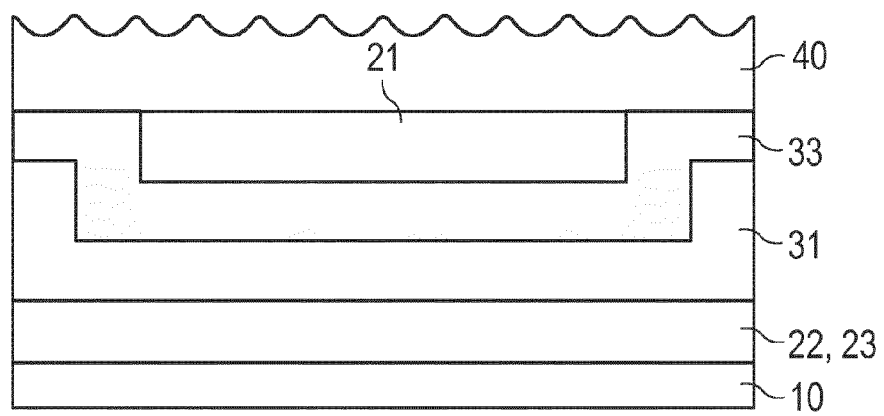

An exemplary embodiment in which an encapsulation layer 33, which is formed for example by silicon dioxide and/or silicon nitride, is arranged between the first encapsulation layer 31 and the first mirror layer 21, is shown in connection with FIG. 6. The encapsulation layer 33 in this case fully covers the lower side and side surfaces 21*c* of the silver mirror 21. In this case, for the production of the first encapsulation layer 31, it is possible to use an ALD method in which ozone is used as a precursor material.

Figure 7:
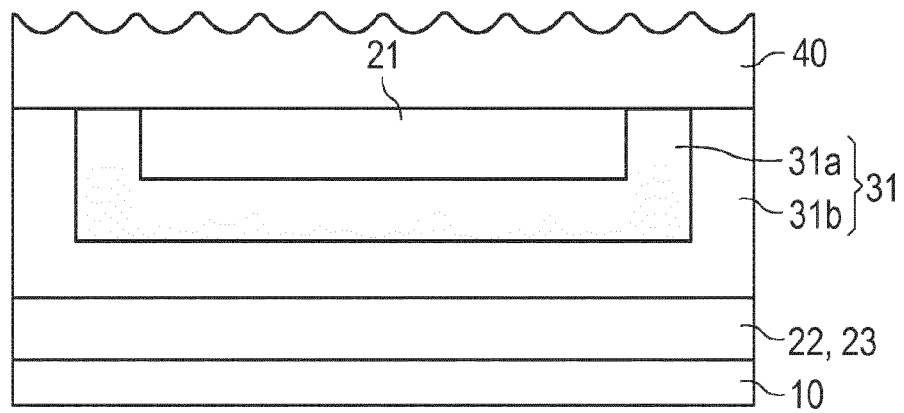

An exemplary embodiment in which the first encapsulation layer 31 has a first sublayer 31*a*, which directly adjoins the first mirror layer 21, and a second sublayer 31*b*, which directly adjoins the first sublayer 31*a*, is described in connection with FIG. 7. The first sublayer 31*a* is formed, for example, by an ALD method which is free of ozone as a precursor material. For example, water or oxygen is used as a precursor material in this case. The first sublayer 31*a* has, for example, a thickness of between 5 and 10 nm. The first sublayer 31*a* fully covers the first mirror layer 21 on its lower side facing toward the carrier and on its side surfaces 21*c*.

Formed on the lower side, facing away from the mirror layer 21, and on the side surfaces of the first sublayer 31*a*, there is the second sublayer 31*b* for which an ALD method that uses ozone as a precursor material is employed. In this way, on the one hand, the first encapsulation layer 31 can be applied onto the mirror layer 21 without causing damage, and on the other hand the first mirror layer 31 is distinguished by a particularly high leaktightness in relation to moisture. Overall, the first layer 31 has for example a thickness of 40 nm.

By the description with the aid of the exemplary embodiments, the invention is not restricted to these exemplary embodiments. Rather, the invention covers any new feature and any combination of features, which includes in particular any combination of features in the patent claims, even if this feature or this combination is not explicitly indicated per se in the patent claims or the exemplary embodiments.

The invention claimed is:

1. An optoelectronic semiconductor chip comprising:
a semiconductor body comprising an active region configured to generate electromagnetic radiation;
a first mirror layer configured to reflect the electromagnetic radiation;
a first encapsulation layer including an electrically insulating material; and
a carrier mechanically supporting the first encapsulation layer, the first mirror layer and the semiconductor body,
wherein the first mirror layer is arranged between the carrier and the semiconductor body,
wherein the first encapsulation layer is arranged between the carrier and the first mirror layer, and
wherein the first encapsulation layer is an ALD layer; and
a second encapsulation layer arranged between the carrier and the first encapsulation layer,
wherein the second encapsulation layer is electrically insulating,
wherein the second encapsulation layer is in direct contact with the first encapsulation layer, and
wherein the second encapsulation layer covers at least 90% of an outer surface of the first encapsulation layer.

2. The optoelectronic semiconductor chip according to claim 1, further comprising a through-contact that passes through the first encapsulation layer, the first mirror layer and the active region.

3. The optoelectronic semiconductor chip according to claim 2, wherein, apart from any through-contacts, the semiconductor body is fully enclosed by encapsulation layers which are ALD layers.

4. The optoelectronic semiconductor chip according to claim 2, wherein the first encapsulation layer fully covers the carrier on an upper side facing toward the semiconductor body except for regions in which one or more through-contacts passes through the first encapsulation layer.

5. The optoelectronic semiconductor chip according to claim 2, further comprising a second mirror layer arranged on a lower side of the through-contact facing toward the carrier, wherein the first encapsulation layer is arranged in regions between the first mirror layer and the second mirror layer.

6. The optoelectronic semiconductor chip according to claim 2,
wherein the carrier is electrically conductive, and
wherein the carrier is electrically conductively connected to the through-contact.

7. The optoelectronic semiconductor chip according to claim 1, further comprising a third mirror layer that extends beyond a side surface of the semiconductor body in a lateral direction, wherein the first encapsulation layer extends at least in regions on a side, facing away from the carrier, of the third mirror layer.

8. The optoelectronic semiconductor chip according to claim 1, wherein a side surface of the first mirror layer is free of the first encapsulation layer.

9. The optoelectronic semiconductor chip according to claim 1, wherein the first encapsulation layer has a thickness of between at least 0.05 nm and at most 500 nm.

10. The optoelectronic semiconductor chip according to claim 1, wherein the first encapsulation layer consists of an electrically insulating material.

11. The optoelectronic semiconductor chip according to claim 1, wherein the first encapsulation layer has a polycrystalline or amorphous structure.

12. The optoelectronic semiconductor chip according to claim 1, further comprising a third encapsulation layer arranged between the first encapsulation layer and the semiconductor body,
wherein the third encapsulation layer is electrically insulating, wherein the third encapsulation layer is in direct contact with the first encapsulation layer, and wherein the third encapsulation layer covers at least 90% of an outer surface of the first encapsulation layer.

13. The optoelectronic semiconductor chip according to claim 12, wherein a thickness of the second encapsulation layer and of the third encapsulation layer is at least six times a thickness of the first encapsulation layer.

14. The optoelectronic semiconductor chip according to claim 12, further comprising a fourth encapsulation layer that fully covers regions of an outer surface of the semiconductor body that are not covered by the carrier, and wherein the fourth encapsulation layer is an ALD layer.

15. The optoelectronic semiconductor chip according to claim 14, wherein the first encapsulation layer and the fourth encapsulation layer are in direct contact with one another in regions.

16. The optoelectronic semiconductor chip according to claim 14, further comprising a fifth encapsulation layer that is electrically insulating and is in direct contact with the fourth encapsulation layer.

17. The optoelectronic semiconductor chip according to claim 16, wherein at least one of the second, third or fifth encapsulation layers comprises at least two partial layers that are formed by a different material from one another.

18. The optoelectronic semiconductor chip according to claim 14, further comprising an electrical connection region arranged laterally separated from the semiconductor body, wherein the electrical connection region is laterally enclosed fully by the first encapsulation layer, the fourth encapsulation layer or a combination of the first and fourth encapsulation layers.

* * * * *